United States Patent [19]

Legg

[11] Patent Number: 4,696,829

[45] Date of Patent: Sep. 29, 1987

[54] PROCESS FOR INCREASING THE WEAR LIFE OF CERAMIC DIES AND PARTS

[75] Inventor: Keith O. Legg, Atlanta, Ga.

[73] Assignee: Georgia Tech Research Corporation, Atlanta, Ga.

[21] Appl. No.: 772,187

[22] Filed: Sep. 3, 1985

Related U.S. Application Data

[63] Continuation of Ser. No. 614,555, May 29, 1984, abandoned.

[51] Int. Cl.$^4$ .............................................. B05D 3/06
[52] U.S. Cl. ...................................................... 427/38
[58] Field of Search ..................................... 427/38

[56] References Cited

U.S. PATENT DOCUMENTS

| | | | |
|---|---|---|---|
| 4,105,443 | 8/1978 | Dearnaley et al. | 427/38 X |
| 4,262,056 | 4/1981 | Hubler et al. | 427/38 X |
| 4,465,337 | 8/1984 | Baron | 427/38 X |

Primary Examiner—Bernard D. Pianalto
Attorney, Agent, or Firm—Newton, Hopkins & Ormsby

[57] ABSTRACT

A process for increasing the wear life of ceramic dies or other ceramic parts which entails firing a beam of nitrogen, carbon or carbon monoxide ions into the ceramic dies or other parts with an energy sufficient to implant the ions in the dies and other parts. This process enhances the wear resistance of the dies and parts, thereby increasing the wear life of the same.

The process is particularly useful for treating ceramic dies and other parts which are used in industrial processing.

14 Claims, No Drawings

PROCESS FOR INCREASING THE WEAR LIFE OF CERAMIC DIES AND PARTS

This is a continuation of co-pending application Ser. No. 614,555 filed on May 29, 1984 now abandoned.

BACKGROUND OF THE INVENTION

1. Field of the Invention

This invention relates to a process for increasing the wear life of ceramic dies and other ceramic parts used in industrial processing.

2. Description of the Prior Art

Ion implantation is a process for injecting atoms of any element into any solid material to selected depths and concentrations in order to form an alloy or other solid mixture that has a different composition from the original solid. The different composition so formed exhibits different and often highly desirable chemical and physical properties. *Encyclopedia of Chemical Technology,* Kirk-Othmer, Vol. 13, p. 706 (1981).

By the process of ion implantation, atoms of a selected chemical element are ionized by collisions with electrons in an electrical discharge in a gas at low pressure. These ions pass through an orifice into a high-vacuum region where they are accelerated by an electric field to a moderate energy. The selected ions are then accelerated to the desired energy, refocused by a quadrupole lens, deflected by a scanner system, collimated by a defining aperture, and allowed to strike the target. When the ions penetrate the target lattice, they lose energy through collisions with lattice atoms and come to rest therein. *Encyclopedia of Chemical Technology,* id.

Metal alloys produced by ion implantation generally have the same corrosion properties as conventional bulk alloys of about the same composition. Moreover, as ion implantation is essentially a brute force (athermal) process involving individual atoms, the process is not restricted by the laws of thermodynamics governing equilibrium processes. For example, the implanted atoms can be placed at any desirable location and to any desired concentration in a solid material (within the limitations of available ion energy) without being restricted by diffusivity constants or solubility constants. *Encyclopedia of Chemical Technology,* id. Appropriately, ion implantation has been used in the treatment of steels and carbides.

U.S. Pat. No. 3,832,219 illustrates the use of ion implantation in the treatment of stainless and mild steels to modify their surface structure to produce harder or more corrosion resistant surfaces. The ions used are carbon (C), for hardening, and chromium (Cr) for corrosion resistance. Ion energies used are 1–200 KeV.

U.S. Pat. No. 4,105,433 illustrates the use of ion implantation with Co-cemented tungsten carbide (WC) tools. The ions used are $Co^+$, $B^+$, $N^+$, $O^+$ and $Cl^+$. By implanting these ions in these tools, reduced adhesion is observed between the Co binder phase in the tool and the metal being treated. The ion dosage or fluence must be greater than $10^{17}$ ions $cm^{-2}$ to achieve this effect of reduced adhesion.

Unrelated to ion implantation, but often confused therewith, is ion plating. Ion plating is a coating process which occurs in a glow discharge in a gas at a pressure of a few Pascals, and the energies of the ions and neutral atoms as they strike the surface are from 0.2–1 Kev. In contrast to this, ion implantation does not produce a coating. Moreover, with ion implantation there is no sharp interface between the implanted region and the substrate as there is with ion plating. *Encyclopedia of Chemical Industry,* id.

U.S. Pat. Nos. 3,915,757 and 3,988,955 illustrate the use of an ion plating technique to plate a metal tool surface to increase the hardness of the tool surface. The increased metal hardness provides tools which have superior cutting power and durability.

The ion-nitriding process disclosed in U.S. Pat. No. 4,194,930 forms a metal nitride on the surface by placing the metal in a discharge of nitrogen and hydrogen gas. This process is a surface coating treatment and not an ion implantation treatment.

U.S. Pat. No. 4,252,626 illustrates the use of ion plating to produce ceramic coatings on other materials. Ions are used to sputter material from a ceramic target. This material then lands on the substrate to be coated, forming a surface film. The ions are not used to modify the ceramic target, but only to sputter material therefrom.

In recent years, the use of ceramic dies and parts has greatly increased. As a class of materials, ceramics are better electrical and thermal insulators and are more stable in chemical and thermal environments than are metals. Moreover, high performance ceramic materials often have greatly improved piezoelectric, magnetic, pyroelectric, electro-optic, laser and mechanical properties. Appropriately, ceramic materials have found use in many new, demanding and highly technical applications.

Not surprisingly, the ceramics industry has devised production and control techniques for mass producing complex shapes in ceramic bodies having carefully controlled electrical, magnetic and/or mechanical properties, while maintaining dimensional tolerances which are good enough to permit relatively easy assembly with other components. *Encyclopedia of Chemical Technology,* id.

With the extensive use of ceramic dies and other ceramic parts, particularly in highly degradative chemical and thermal environments, it would be very desirable to enhance the wear resistance of these dies and parts. However to date, techniques for improving the wear resistance of ceramic dies and parts have generally involved depositing hard coatings such as titanium nitride on the dies and parts. These techniques have the disadvantage of possible spalling, flaking or cracking, and inevitably, of changing the size of the original part. In such an instance, it is often necessary to manufacture an oversize die or an undersize drill, for example, which can be an expensive undertaking.

Hence, a need continues to exist for a process which increases the wear life of ceramic dies and other ceramic parts wherein the die or part does not suffer from spalling, flaking or cracking and wherein the original dimensional tolerances of the die or part remain unaffected.

SUMMARY OF THE INVENTION

Accordingly, it is an object of the present invention to provide a process for increasing the wear life of ceramic dies and other ceramic parts.

It is also an object of this invention to provide a process for increasing the wear life of ceramic dies and other ceramic parts without having the die or part suffer from spalling, flaking or cracking of a protective coating thereon.

Moreover, it is further an object of the present invention to provide a process for increasing the wear life of ceramic dies and other ceramic parts wherein the original dimensional tolerances of the die or part remain unaffected.

According to the present invention, the foregoing and other objects are attained by providing a process for increasing the wear life of ceramic dies and other ceramic parts which comprises firing a beam of nitrogen, carbon or carbon monoxide ions into the ceramic dies or other parts with an energy sufficient to implant said ions in said dies and other parts, thereby improving the wear resistance of the same.

DETAILED DESCRIPTION OF THE PREFERRED EMBODIMENTS

According to the present invention, a process has now been provided whereby ceramic dies or other ceramic parts of superior wear resistance are produced. Through this increased wear resistance, the wear life of the produced ceramic dies or other parts is extended. This life may be defined either as the number of hours that the ceramic part is in production use or, equivalently, for items such as ceramic dies, the amount of product processed before the part must be retired from service. For dies, this point is reached when the hole diameter has been worn too large to produce extruded material within the manufacturer's specifications.

Older techniques for improving wear resistance generally involve depositing hard coatings such as titanium nitride. Such techniques have the disadvantages of possible spalling, flaking or cracking, and inevitably, of changing the size of the original part. In using these techniques, it is often necessary to manufacture an oversize die or an undersize drill, for example, which can be an expensive undertaking.

The process of the present invention involves firing a beam of nitrogen, carbon, or carbon monoxide ions into the ceramic dies or other parts with an energy sufficient to implant the ions in the ceramic material of the dies or other parts. The implantation of these ions in the ceramic material of the dies or other parts produces a ceramic die or other parts which has significantly increased wear resistance. While similar processes have been used for metal and carbide tools and not for ceramic tools, the application of such processes to ceramics has yielded surprisingly good results. Such results are, indeed, unexpected.

The ions in the fired beam generally have energies in the range of 30 KeV to 5 MeV and are fired into the ceramic dies or parts to a dose or fluence of about $10^{15}$ to $6 \times 10^{17}$ ions per square centimeter of area normal to the beam. The angle of the implant may vary from about 90° to about 15° with respect to the ceramic surface. With a die this is achieved by firing into the hole at an angle between 20° and 50° to the face normal and rotating the die either continuously or in discrete steps about its surface normal to achieve a fairly even implant within the hole. While ions of nitrogen, carbon or carbon monoxide may be used, according to the present invention, the ions of nitrogen, N+, and $N_2$+, are of particular interest. The ceramic material treated can be any type of ceramic material such as structural clay products, like brick, tile, terra cotta or glazed architectural brick; whitewares, like dinnerware or chemical and electrical porcelain such as spark plugs; porcelain enamels; refractories; Portland cement; abrasive materials such as fused alumina, silicon carbide and related products; and aluminum silicate fibres. Of particular interest, however, are the ceramic dies and other ceramic parts used in industrial processing which contain zirconia, alumina, silica, boride, nitride or carbide. In addition to ceramic dies, any ceramic parts which are used in high wear situations, such as thread guides and eyelets used in the textile industry, may be treated with the present process to improve the wear resistance thereof.

According to the present process, the original tolerances of the part are unaffected. This allows the process to be applied to tools exactly as they are used in the factory. Further handling or refinishing is not required. Furthermore, since the implant is an integral part of the tool, there is no possibility of spalling, cracking, or flaking.

Implant conditions for ceramics are completely different from those used to treat metals. In a metal, overimplantation generally is not a problem but can be a serious problem when implanting ions in ceramic materials. For example, in zirconia, excessive implantation results in blister formation and, ultimately, spalling on the surface. Hence, the implant dose or fluence must be kept down to a specified level to prevent blistering.

It has been found that the distribution of implanted ions is subject to a stress driven diffusion, forcing the peak of the distribution to spread and produce a roughly constant ion concentration over the entire implant depth. This is totally at variance with the situation found in most other materials.

Having now fully described this invention, it will be apparent to one of ordinary skill in the art that many changes and modifications can be made thereto without departing from the spirit or scope of the invention as set forth herein.

What is claimed as new and desired to be secured by Letters Patent of the United States is:

1. A process for increasing the wear life of ceramic dies and other ceramic parts which comprises firing a beam of nitrogen, carbon or carbon monoxide ions into said ceramic dies and other parts which an energy sufficient to implant said ions in said die and other parts, thereby improving the wear resistance of the same.

2. The process of claim 1, wherein the energy of said ions is in the range of 30 KeV to 5 MeV.

3. The process of claim 1, wherein said ions are fired into the ceramic dies or other parts to a dose or fluence of about $10^{15}$ to $6 \times 10^{17}$ ions cm$^{-2}$.

4. The process of claim 1, wherein said ions are fired into the ceramic dies or other parts with an angle of implant of about 90° to 15° with respect to the ceramic surface.

5. The process of claim 1, wherein said ions are N+ and $N_2$+ ions.

6. The process of claim 1, wherein said ions are N+ ions.

7. The process of claim 6, wherein said N+ ions have an energy in the range of 30 KeV to 5MeV.

8. The process of claim 1, wherein the implantation is a direct implantation.

9. The process of increasing the wear life of ceramic dies and other ceramic parts which comprises the steps of:
   (a) firing a beam of nitrogen, carbon or carbon monoxide ions into the working surface area of the ceramic part which is subjected to wear; and
   (b) controlling the energy of said ions to implant the ions into said working surface area in a roughly constant ion concentration over the entire implant depth and to a fluence which does not cause blistering of said working surface area but sufficient to increase the resistance of said working surface area to wear.

10. The process as defined in claim 9 wherein the energy of said ions is in the range of 30 KeV to 5 MeV and said fluence is about $10^{15}$ $6 \times 10^{17}$ ions per square centimeter.

11. A process for increasing the wear life of ceramic dies and other ceramic parts comprising the steps of
   a. firing a beam of ions, wherein said ions are selected from the group consisting of nitrogen, carbon and carbon monoxide, into said ceramic dies and parts for implanting said ions within said dies and parts;
   b. maintaining the energy of said ions within the range of approximately 30 KeV to 5 MeV;
   c. maintaining the concentration of said ions within the range of approximately $1 \times 10^{15}$ to $6 \times 10^{17}$ ions per square centimeter of area normal to said beam; and
   d. rotating said dies or parts during said implantation.

12. A process as defined in claim 11 and including the further step of firing said ions at said dies and parts at an angle within the range of 90° to 15° relative to the outer surface of said dies and parts.

13. A process as defined in claim 12 wherein said ions are $N^+$ and $N_2^+$ ions.

14. A process as defined in claim 12 wherein the implantation is a direct implantation.